United States Patent
Dreps et al.

(10) Patent No.: US 7,301,320 B2
(45) Date of Patent: Nov. 27, 2007

(54) ON-CHIP HIGH FREQUENCY POWER SUPPLY NOISE SENSOR

(75) Inventors: Daniel M. Dreps, Georgetown, TX (US); Seongwon Kim, Old Tappan, NJ (US); Michael A. Sperling, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 358 days.

(21) Appl. No.: 11/040,225

(22) Filed: Jan. 21, 2005

(65) Prior Publication Data

US 2006/0164059 A1   Jul. 27, 2006

(51) Int. Cl.
G05F 5/00 (2006.01)
H02J 1/02 (2006.01)

(52) U.S. Cl. ...................................... 323/299
(58) Field of Classification Search ................ 323/299, 323/300, 303, 312, 315–317; 327/51–56, 327/77, 78, 90
See application file for complete search history.

(56) References Cited

U.S. PATENT DOCUMENTS

| | | | | |
|---|---|---|---|---|
| 4,275,419 A | * | 6/1981 | Wilcox | 348/690 |
| 5,604,466 A | * | 2/1997 | Dreps et al. | 331/113 R |
| 5,912,703 A | * | 6/1999 | Tamayama | 348/241 |
| 6,605,929 B2 | * | 8/2003 | Tsukagoshi et al. | 323/223 |
| 7,031,886 B1 | * | 4/2006 | Hargreaves | 702/191 |

* cited by examiner

Primary Examiner—Matthew V. Nguyen
(74) Attorney, Agent, or Firm—Lynn L. Augspurger; Laurence J. Marhoefer

(57) ABSTRACT

The on-chip power supply noise sensor detects high frequency overshoots and undershoots of the power supply voltage. By creating two identical current sources and attaching a time constant circuit to only one, the high frequency transient behavior differs while the low frequency behavior is equivalent. By comparing these currents, the magnitude of very high frequency power supply noise can be sensed and used to either set latches or add to a digital counter. This has the advantage of directly sensing the power supply noise in a manner that does not require calibration. Also, since the sensor requires only one power supply, it can be used anywhere on a chip. Finally, it filters out any lower frequency noise that is not interesting to the circuit designer and can be tuned to detect down to whatever frequency is needed.

3 Claims, 2 Drawing Sheets

ON-CHIP HIGH FREQUENCY POWER SUPPLY NOISE SENSOR

BACKGROUND OF THE INVENTION

1. Field of the Invention

This invention relates to an improved on-chip detector of noise on the power supply input to the chip, and more particularly to a detector that can respond to high frequency, low magnitude noise levels and can be implemented with CMOS process technology.

2. Description of Background

An undetected noise signal introduced via the power supply to a processor, memory, or other integrated circuit chip, can damage the chip and/or cause an error in the chip function. A typical power supply may include circuits to regulate the power supply output in order to minimize and suppress noise in the power supplied to the chip that would take the power supply voltage out of the range permitted by the chip design. Notwithstanding such power supply regulation, noise, particularly high frequency noise signals riding on the dc power supply voltage, can be coupled to the chip. As pointed out above, if undetected, such noise signals can damage the chip and/or cause an undetected error in the chip's operation. A proposal in the prior art for on-chip detection of noise signals riding on the power supply input in U.S. Pat. No. 6,605,929, employs bipolar transistors and can detect only noise signals of a large magnitude.

SUMMARY OF THE INVENTION

An object of this invention is the provision of an on-chip power supply noise detector that can be produced with the same state of the art CMOS process technology used to produce the circuits on the chip.

Another object of this invention is the provision of an on-chip power supply noise detector that directly senses power supply noise and thus does not require calibration.

A further object of the invention is the provision of an on-chip power supply noise detector that can be tuned so that it responds only to noise in a frequency range that could cause damage or errors to the chip or errors in its performance.

A still further object of the invention is the provision of an on-chip power supply noise detector uses a single power input from the power supply, allowing it to be placed any where on the chip.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing objects and other objects, features, and advantages of the invention are apparent from the following detailed description taken in conjunction with the accompanying drawings in which:

DETAILED DESCRIPTION OF THE INVENTION

Figure 1:
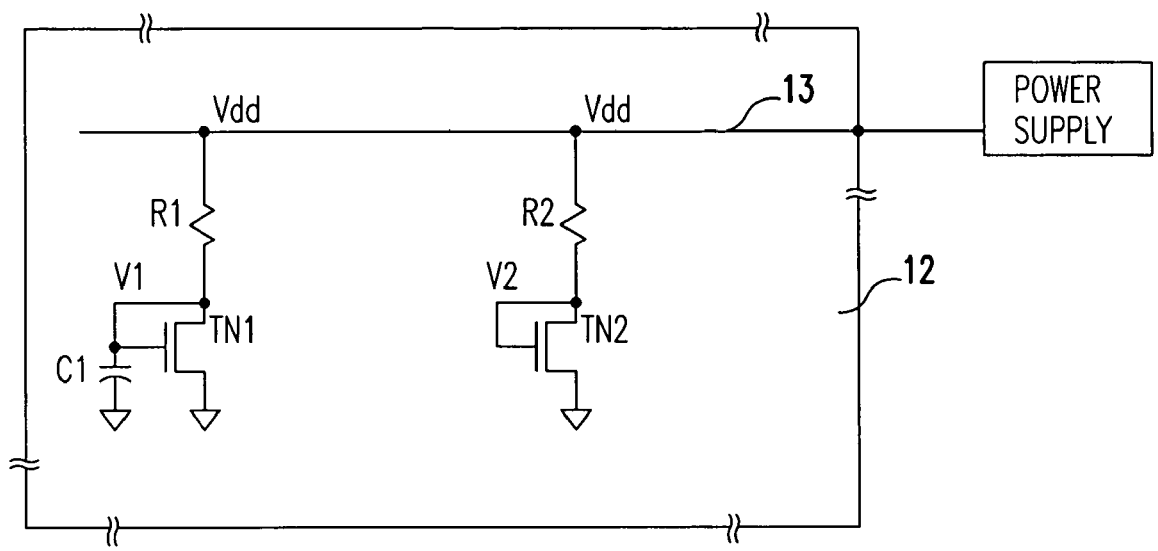
FIG. 1 is a schematic diagram of one embodiment of two current sources with respectively different time constants that can be used on-chip to detect power supply noise in accordance with the teachings of this invention.
Figure 2:
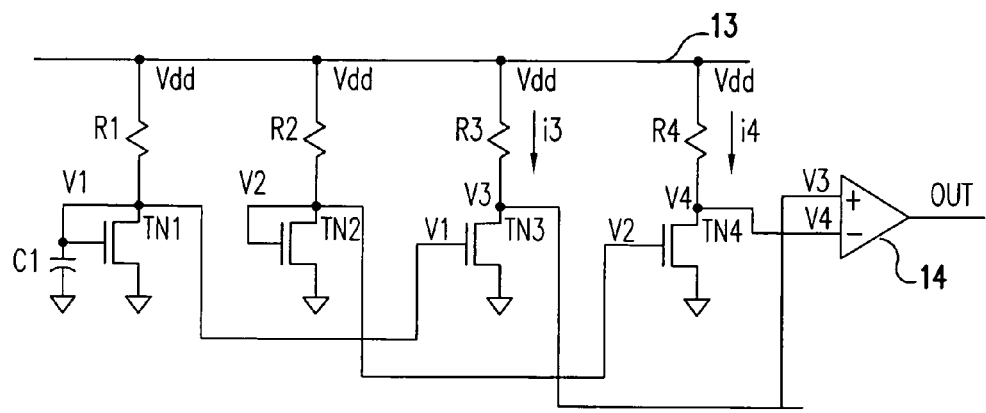
FIG. 2 is a schematic diagram of a circuit employing the two current sources in FIG. 1 to detect on-chip power supply noise.
Figure 3:
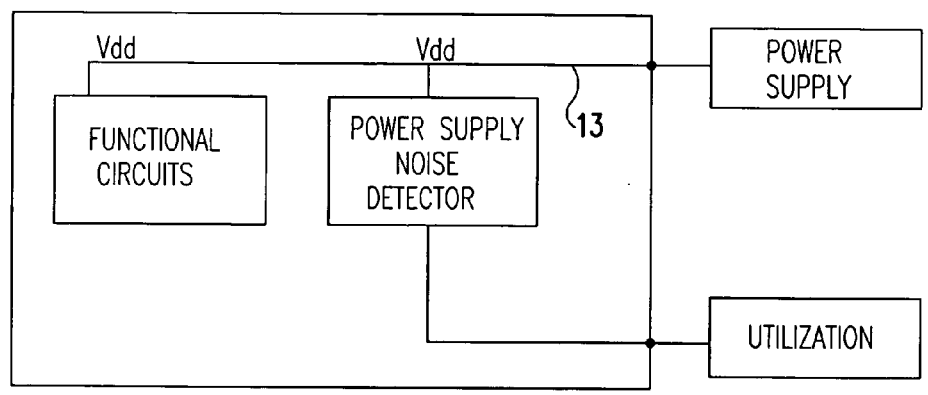
FIG. 3 is a block diagram of a chip with an on-chip noise detector in accordance with the teachings of this invention.

Referring now to FIG. 1 of the drawings, a pair of CMOS FETs TN1 and TN2 and their associated circuitry is formed on chip 12, preferably in the same process as used to form the functional components on the chip. The transistors TN1 and TN2 are connected each as a simple current generator, with resistors R1 and R2 connected to voltage Vdd on the chip's internal power supply bus 13. The value of TN1 and TN2 and the resistance of R1 and R2 are the same. The drain of each transistor TN1 and TN2 is connected to its gate so that the current in each is largely dependent on the power supply voltage Vdd. A capacitor C1 couples the gate of TN1 to common, with the capacitor C1 acting as a low pass filter where the resistance of the filter time constant is given by the inverse transconductance of transistor TN1 in parallel with the resistor R1. The current through TN2 will track changes in the power supply voltage Vdd introduced via bus 13 substantially instantaneously while the current through TN1 will respond to changes in Vdd more slowly. If the frequency of the power supply noise is within the pass band of the low pass filter that includes C1, the value of the currents through TN1 and TN2 will be the same. If the frequency of the power supply noise is greater than the time constant band with of the filter, there will be a difference in the value of the currents through TN1 and TN2 and the difference will be a function of the magnitude of the noise and its frequency.

In order to detect a difference in the current flow through TN1 and TN2, the gate voltages V1 and V2 of TN1 and TN2 are mirrored to CMOS FETs TN3 and TN4 by coupling V1 to the gate of TN3 and V2 to the gate of TN4. Resistor R3 couples the drain of transistor TN3 to Vdd and resistor R4 couples the drain of TN4 to Vdd. These components are fabricated with the same processes as the processes used to fabricate the functional components of the chip. The current I4 through TN4 will track rapid changes in the power supply voltage Vdd so that the voltage V4 will remain constant in spite of such changes. The current I3 through TN3 will not track such changes as quickly as the current I4 tracks these changes, resulting in a higher voltage V3 when the power supply voltage rises due to noise and a lower voltage V3 when the power supply voltage drops due to noise. The voltages V3 and V4 are coupled to the inputs of a differential amplifier 14 whose output indicates any imbalance between V3 and V4 due to noise on the power supply input Vdd. The differential amplifier is on the chip and it uses the same supply voltage as TN1 and TN2. Since its operation is differential, it is not affected by power supply noise. Here it should be noted, V3 will settle back to being equal to V4 when the capacitor C1 has been charged.

In a practical circuit, the magnitude threshold of a noise spike that can be detected, can be established by changing the size of TN3 relative to TN4. When the noise magnitude is greater than the percent difference in size of the said two transistors the output of the differential amplifier 14 will change. This output can set a latch or index a counter or the like.

While the preferred embodiment of the invention has been described, it will be understood that those skilled in the art, both now and in the future, may make various improvements and enhancements which fall within the scope of the claims which follow. These claims should be construed to maintain the proper protection of the invention first described.

The invention claimed is:

1. An on-chip detector for detecting noise on the chip's power supply bus comprising in combination:
   a first current source on said chip, said first current source connected to the power supply bus and responding quickly to a change in supply voltage on said bus;
   said first current source includes a first FET transistor having a source, a drain, and a gate connected to said drain, a first resistor connecting said bus to said first FET transistor's drain, and a capacitor connecting said gate to said source, and said second current source includes a second FET transistor having a source, a drain, and a gate connected to said drain, a second resistor connecting said bus to said second FET transistor's drain;
   a second current source on said chip, said second current source connected to said power supply bus and responding more slowly than said first current source to said change in said supply voltage; and
   means responsive to a difference in current flow between said first current source and said second current source to generate an output signal indicating the presence of a noise signal on said bus.

2. An on-chip detector as in claim 1, further including a first amplifier connected to said bus to amplify the voltage at the source of said first FET transistor and a second amplifier connected to said bus to amplify the voltage at the source of said second FET transistor, and means to compare the amplified outputs of said first amplifier and said second amplifier.

3. An on-chip detector as in claim 2, wherein said means to compare is a differential amplifier.

* * * * *